US009229110B2

(12) United States Patent
Kallio (10) Patent No.: US 9,229,110 B2
(45) Date of Patent: Jan. 5, 2016

(54) ATMOSPHERIC HUMIDITY OR TEMPERATURE OR CLOUD HEIGHT MEASURING METHOD AND APPARATUS

(75) Inventor: Jukka Kallio, Helsinki (FI)

(73) Assignee: VAISALA OYJ, Helsinki (FI)

( * ) Notice: Subject to any disclaimer, the term of this patent is extended or adjusted under 35 U.S.C. 154(b) by 293 days.

(21) Appl. No.: 13/635,363

(22) PCT Filed: Apr. 28, 2011

(86) PCT No.: PCT/FI2011/050382
§ 371 (c)(1),
(2), (4) Date: Apr. 10, 2013

(87) PCT Pub. No.: WO2011/135183
PCT Pub. Date: Nov. 3, 2011

(65) Prior Publication Data
US 2013/0192342 A1 Aug. 1, 2013

(30) Foreign Application Priority Data
Apr. 30, 2010 (FI) ..................................... 20105476

(51) Int. Cl.
*G01S 17/95* (2006.01)
*G01W 1/00* (2006.01)
*H01S 5/40* (2006.01)
*G01S 7/481* (2006.01)
(Continued)

(52) U.S. Cl.
CPC .............. *G01S 17/95* (2013.01); *G01S 7/4814* (2013.01); *G01W 1/00* (2013.01); *H01S 5/4062* (2013.01); *G01K 2213/00* (2013.01); *G01S 7/4815* (2013.01); *G02B 5/28* (2013.01); *G02B 26/001* (2013.01)

(58) Field of Classification Search
CPC . G01C 3/08; G01N 21/39; G01N 2021/1795; G01S 17/00
USPC ............ 356/3.01–3.15, 4.1, 5.01–5.15, 6–22, 356/28, 28.5
See application file for complete search history.

(56) References Cited

U.S. PATENT DOCUMENTS

| 4,199,226 A | 4/1980 | Weber et al. |
| 4,259,592 A | 3/1981 | Frungel et al. |
| 5,767,953 A * | 6/1998 | McEwan ....................... 356/5.01 |

(Continued)

FOREIGN PATENT DOCUMENTS

| WO | WO 91/06141 | 5/1991 |
| WO | WO 03/005503 A2 | 1/2003 |

OTHER PUBLICATIONS

X. Baillard et al., "Interference-filter-stabilized external-cavity diode lasers" Optics Communications, vol. 266, Issue 2, Oct. 15, 2006, pp. 609-613.

(Continued)

*Primary Examiner* — Luke Ratcliffe
(74) *Attorney, Agent, or Firm* — Muncy, Geissler, Olds & Lowe, P.C.

(57) ABSTRACT

An atmospheric cloud height, humidity profile, or temperature measuring method and arrangement are provided. In the method, pulsed laser signals (14) are transmitted through transmission optics (2, 3, 4, 5, 6) to the atmosphere and the signal (15) reflected or scattered back from there is detected. An interference filter (3) is used in the optics, in order to stabilize the transmitted optical power to the center wavelength of the interference filter (3).

27 Claims, 5 Drawing Sheets

(51) Int. Cl.
*G02B 5/28* (2006.01)
*G02B 26/00* (2006.01)

(56) References Cited

U.S. PATENT DOCUMENTS

| | | | |
|---|---|---|---|
| 6,526,071 B1 * | 2/2003 | Zorabedian et al. | 372/20 |
| 6,556,599 B1 | 4/2003 | Svilans | |
| 6,570,893 B1 | 5/2003 | Libatique et al. | |
| 2002/0054614 A1 | 5/2002 | Jin | |
| 2002/0145607 A1 * | 10/2002 | Dimsdale | 345/423 |
| 2002/0172238 A1 | 11/2002 | Thoma et al. | |
| 2003/0016350 A1 * | 1/2003 | Cheng et al. | 356/301 |
| 2007/0002306 A1 * | 1/2007 | Kalayeh | 356/4.07 |

OTHER PUBLICATIONS

M. Endemann et al., "Simultaneous reomote measurements of atmospheric temperature and humidity using a continuously tunable IR lidar" Applied Optics, vol. 20, Issue 18, Sep. 15, 1981, pp. 3211-3217.

"LIDAR", Wikipedia, the free encyclopedia, available online Apr. 27, 2010 URL: http://en.wikipedia.org/w/index.php?title=LIDAR&oldid=358613041 first paragraph; section "Design"; subsection "Meteorology and Atmospheric Environment".

* cited by examiner

ATMOSPHERIC HUMIDITY OR TEMPERATURE OR CLOUD HEIGHT MEASURING METHOD AND APPARATUS

BACKGROUND OF THE INVENTION

1. Field of the Invention

The present invention relates to a cloud-probing apparatus.

The invention also relates to an atmospheric humidity profile or temperature profile or cloud height measuring apparatus.

2. Brief Description of the Prior Art

According to the prior art, semiconductor pulse lasers (pulsed diode lasers) are used for cloud probing. In these solutions, the laser's entire wavelength band is sent to the object being measured and the backscattered light is detected. In the detection of the backscattered signal, either completely separate detector optics is used, or alternatively partly the same optics has operated in both the transmission and in the detection.

A drawback in the prior art is that, despite its good properties, the method is sluggish, due to the non-ideal properties of the transmitting diode laser. The transmission power of a pulsed diode laser is spread over a wide wavelength range. At high transmission powers, a pulse laser also heats up, and heating causes the centre wavelength of the transmission power to shift. The manufacturing tolerance of the centre wavelength of a diode laser is also large. Due to the broad band and instability, the signal-noise ratio has been unsatisfactory.

In the prior art, test apparatuses are also used, in which the lasers operate in single mode. Such lasers are extremely expensive and, due to the single mode, the output takes place in a linear spectrum, which, in some measurement applications, is hypersensitive to the measuring variables or the properties of the atmosphere.

SUMMARY OF THE INVENTION

The invention is intended to solve at least some of the problems of the prior art described above, and for this purpose to create a completely new type of method and apparatus for the measurement of the atmospheric humidity profile or temperature profile or cloud height.

The invention is based on using an interference filter in the optics, in order to stabilize the optical power transmitted to the centre frequency of the interference filter. The invention is particularly advantageous when the laser is operating in multimode and the laser's radiating area is linear.

More specifically, the present invention provides an atmospheric cloud height, humidity profile, or temperature profile measuring method, in which method pulsed laser signal is transmitted through transmission optics to the atmosphere, and the signal reflected or scattered back from there is detected, wherein an interference filter is used in the optics in order to stabilize transmitted optical power to the centre frequency of the interference filter.

For its part, the present invention provides an atmospheric cloud height or humidity profile measuring apparatus, which comprises a diode pulse laser, and transmission optics, by means of which a pulsed and stabilized laser signal can be formed and transmitted on towards clouds, and means for detecting the signal reflected and scattered back, wherein the apparatus comprises an interference filter for stabilizing the transmitted laser power at the centre frequency of the interference filter.

Considerable advantages are gained with the aid of the applications of the invention.

With the aid of the invention, the signal-noise ratio of atmospheric measurements can be significantly improved, because the signal power being transmitted can be concentrated in a very narrow measuring band.

By means of an embodiment according to the invention, in which a tiltable interference filter is used, a precise stabilization result can be obtained with the aid of very simple mechanical means.

By means of an embodiment according to the invention, in which a spatial slit filter is used, the light energy that has passed through the filter can be guided at exactly the desired optical angle.

Thanks to the multimode, very economical semiconductor laser light sources can be used. Despite the multimode, the spectrum width is suitable for many atmospheric measurement applications.

In the following, the invention is examined with the aid of examples and with reference to the accompanying drawings.

DETAILED DESCRIPTION OF THE PREFERRED EMBODIMENTS

Figure 1A:
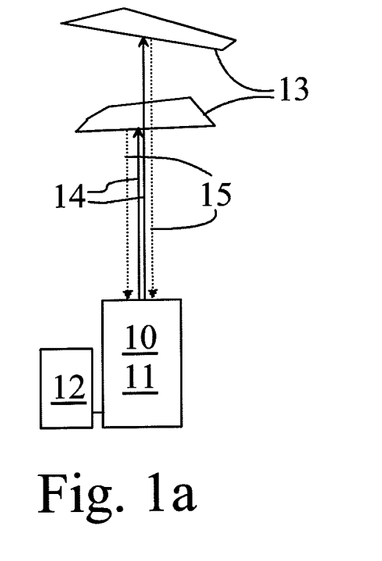
FIG. 1a presents schematically one atmosphere measuring apparatus, in which the invention can be applied.

According to FIG. 1a, the humidity profile and/or temperature and/or cloud height measuring device comprises common transmission and reception optics 10 and 11, from which, with the aid of transmission optics 10 and a light source, laser pulses 14 are sent to the atmosphere and are reflected or scattered back from clouds or other aerosols or molecules 13 back to the detection optics and apparatus 11. The control and measurement logic 12 determines the delays and strengths of the transmitted and received radiation and on their basis the height of the clouds 13 or correspondingly the humidity profile or temperature profile is calculated. The optics according to FIG. 1a can be implemented, for example, coaxially, in which case transmission will take place from the centre of the optics and reception from the circumference of the same optics, or alternatively the locations of the transmission and reception can change places. Instead of being coaxial, transmission and reception can be different sectors of the same optics.

Figure 1B:
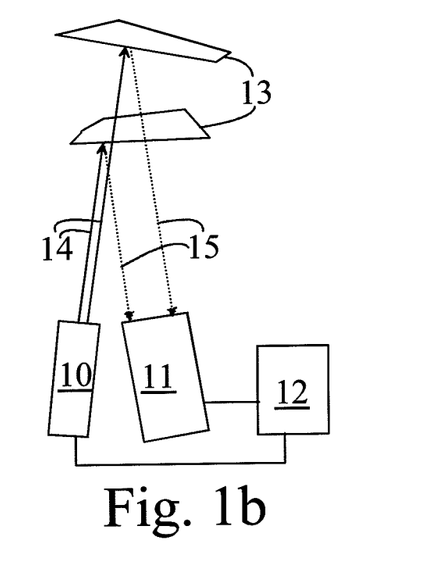
FIG. 1b presents schematically a second atmosphere measuring apparatus, in which the invention can be applied.

According to FIG. 1b, the transmission optics 10 can be separate from the reception optics 11. The solution of the figure is only an example and, for practical reasons, the transmission optics and reception optics can be close to each other, thus permitting measurement from the greatest possible height range.

In both solutions, the control device 12 is typically a computer, which measures the time differences and their intensities between the transmission moment of the outgoing pulses 14 and the reception moment of the signals 15 arriving, detected by the reception detector 11. This technique will be known to one skilled in the art and, as such, does not relate to the invention.

Figure 2:
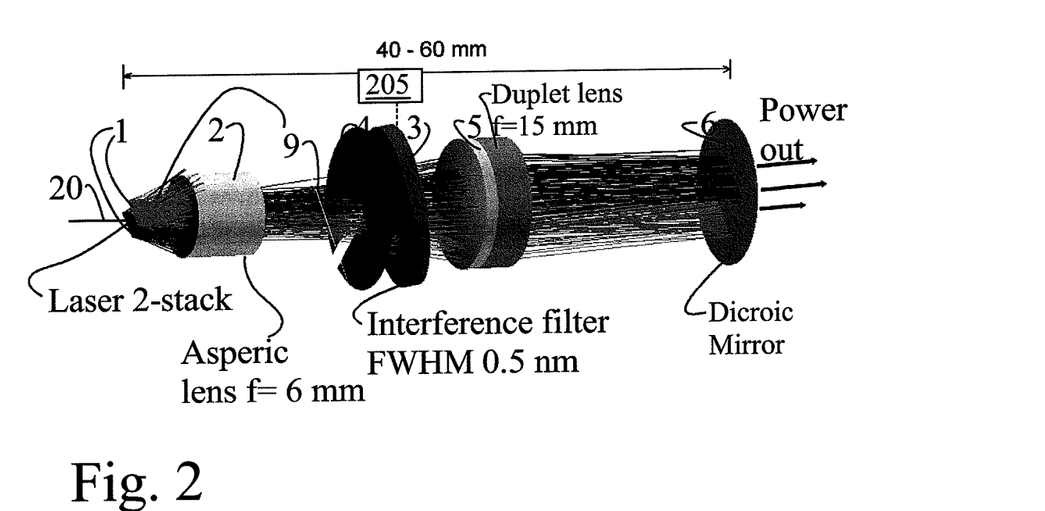
FIG. 2 presents a schematic perspective view of the stabilization optics of the laser according to the invention, for an atmospheric measuring apparatus.
Figure 3:
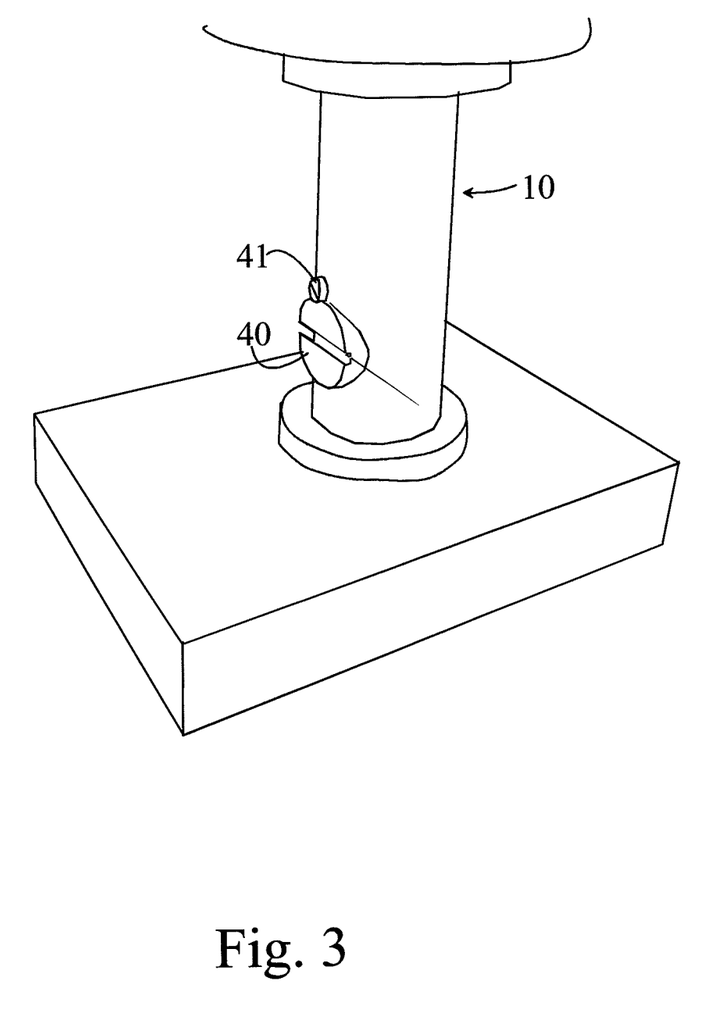
FIG. 3 presents a detail of the mechanical construction of the transmission optics according to the invention.
Figure 9:
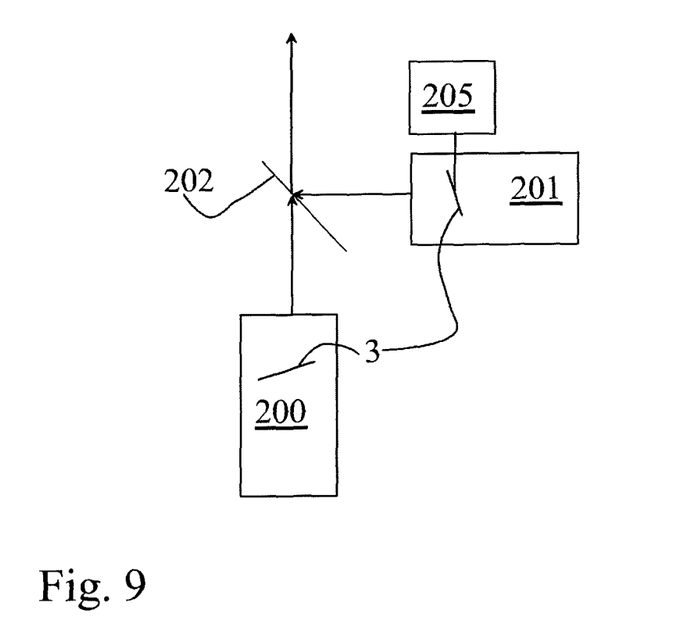
FIG. 9 presents an alternative solution according to the invention, in which the measurement of two or three different wavelengths is implemented using two transmitters and a dichroic mirror.

According to FIG. 2, the transmission optics comprises a diode laser 1, which, in a typical embodiment, consists of a laser radiating from one or more linear areas. In the figure, the dimensions of the laser 1 are exaggerated by the coefficient 10, in order to clarify the figure. A single-line laser source 1 is particularly suitable for the detection of atmospheric humidity profiles, whereas with present knowledge a two-line solution, shown in FIG. 2, is more advantageous for cloud-height measurement. In this example case, the laser's spectrum consists of two narrow lines. The length of the entire optics is about 40-60 mm. In the solution according to FIG. 2, the optical axis is depicted with the reference number 20. Thus, in the figure two laser sources 1 are used to form two pulsed beams of rays 9, coming from a linear area, which, in this embodiment, are guided to an aspheric lens 2, which makes the rays at least substantially parallel. After the lens 2, the beam of rays 9 is guided through a slit mask 4 to an interference filter 3, which, in the solution of the figure, is a tiltable thin-film filter. By tilting the filter, the arrival angle of the beam of rays relative to the filter changes and the filter's centre wavelength can, as is known, be changed in this manner. Due to the multi-layer structure of the filter 3, its tilting reduces the wavelength that passes through the filter. The tilting can be implemented manually, for example, with the aid of the screw 40 shown connected to the filter 3 in FIG. 3, in which case the wavelength is set to be fixed, or alternatively also with the aid of the motor 205 shown in FIG. 9. In the solution of FIG. 3, a locking screw 41 has been added in connection with the adjustment screw 40. The tiltable filter 3 can naturally be replaced with some other adjustable interference filter, such as an interference filter based on heating, or an electrically adjusted interference filter.

In the optics, in the vicinity of the interference filter, there is preferably a slit mask 4 set transversely to the optical axis 20. The slit mask 4 passes light through it only in a direction at right angles to the laser's radiating line and thus limits the laser's feedback to only these waveforms that radiate at a small angle of, for example, less than six degrees, to the optical axis. By means of this slit filter, the power is made to move more to the centre from the edges of the beam. The other optics used can, in the case in the example, exploit only the light that is at an angle of less than ±6 degrees, the rest would be lost. The solution according to the invention will operate even without this mask, but the mask improves the end result.

Next, the beam of rays is guided to a focussing doublet lens 5, which guides the beam of rays 9 on to a dichroic mirror 6, from which part continue out through the rest of the optics to form the outgoing pulses 14 shown in FIGS. 1a and 1b. An enlarged, nearly sharp image of the surface of the laser is created on the dichroic mirror. From the dichroic mirror, some of the radiation energy is reflected in the return direction towards the laser diode. These rays again pass through the interference filter and strike back on the line radiating on the laser's surface, at essentially the same point as they left from. This feedback causes a narrowing of the laser's spectrum and a stabilization of the centre wavelength at the location of the centre wavelength of the interference filter. The transmission optics comprises, in addition, a not-shown, typically collimating transmission lens, which is located on the right-hand side of the figure. In one test solution of the invention, the optical transmission power was 12 mW at a pulse frequency of 10 kHz, the length of the pulses being 100 ns. This corresponds to a pulse energy of 1.2 µJ and a pulse power of about 12 Watts.

FIG. 3 shows in greater detail the manner of adjustment of a tiltable interference filter 3. A screw 40, by adjusting the attitude of which the angle of the filter 3 can be controlled, connected mechanically to the filter 3, is brought to the outer surface of the optics. Naturally, the adjustment can also be implemented through a suitable transmission mechanism.

Figure 4:
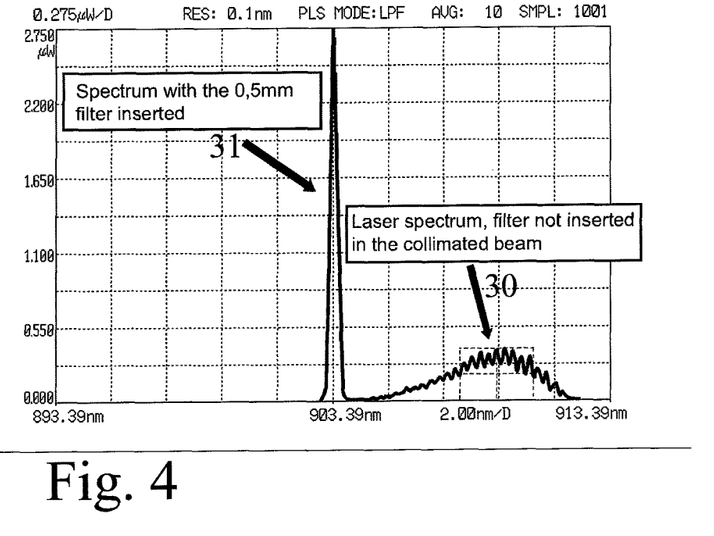
FIG. 4 presents graphically the effect of the solution according to the invention in the transmission optics.

FIG. 4 illustrates the effect of the invention with the aid of a measurement. In FIG. 4, the horizontal axis is the wavelength and the vertical axis the amplitude of the outgoing signal. The right-hand shallow signal 30 depicts the power of the outgoing signal 14 without an interference filter 3 and the left-hand narrow peak 31 the spectrum of the outgoing signal correspondingly with a filter 3. In this case, the laser is thus tuned to the wavelength 31.

As can be seen from the figure, the interference filter can be used to make the intensity of the laser about ten times the wavelength unit.

Figure 5:
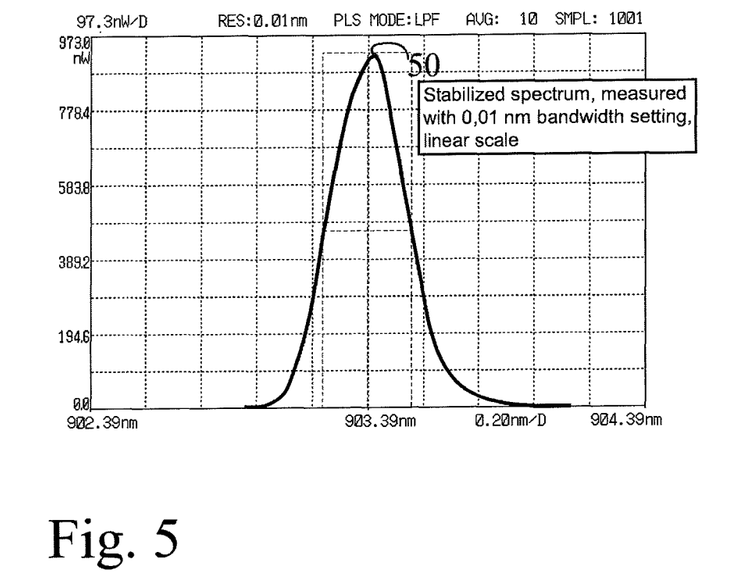
FIG. 5 presents graphically in greater detail the effect of the invention in the transmission optics.

In FIG. 5, the information is shown on a more precise wavelength scale and the centre wavelength is marked with the reference number 50.

Figure 6:
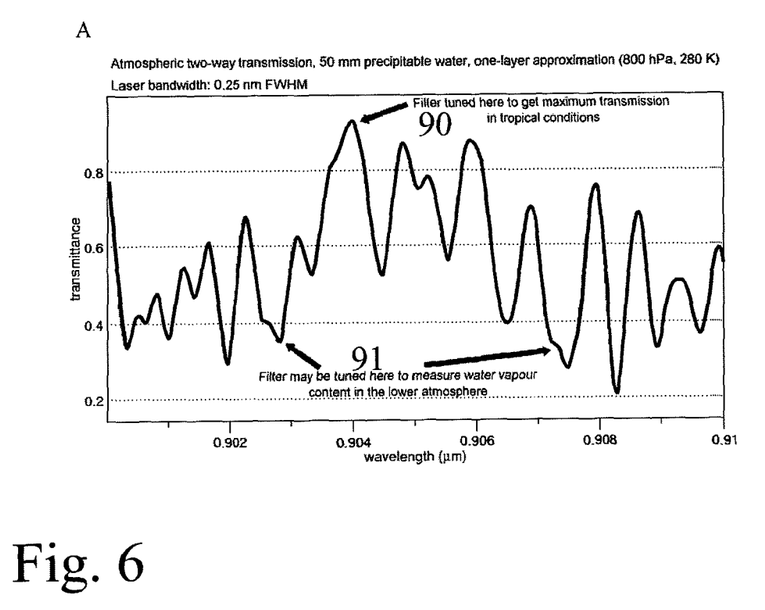
FIG. 6 presents graphically alternative (ways) wavelengths, to which the laser can be stabilized.

According to FIG. 6, various alternatives exist in terms of the tuning of the filter 3, always according to the embodiment. The reference number 90 is used to show the recommended laser tuning wavelength for maximum transmittance in tropical conditions, in which the atmosphere contains a great deal of water vapour. Thus, at this tuning, it is possible to achieve maximum probing heights. The reference number 91, on the other hand, is used to show wavelengths, at which good result can be obtained in measurement at a lower atmospheric moisture content. The backscattering measured using the wavelengths of reference number 90 and reference number 91 are then compared with each other.

Figure 7:
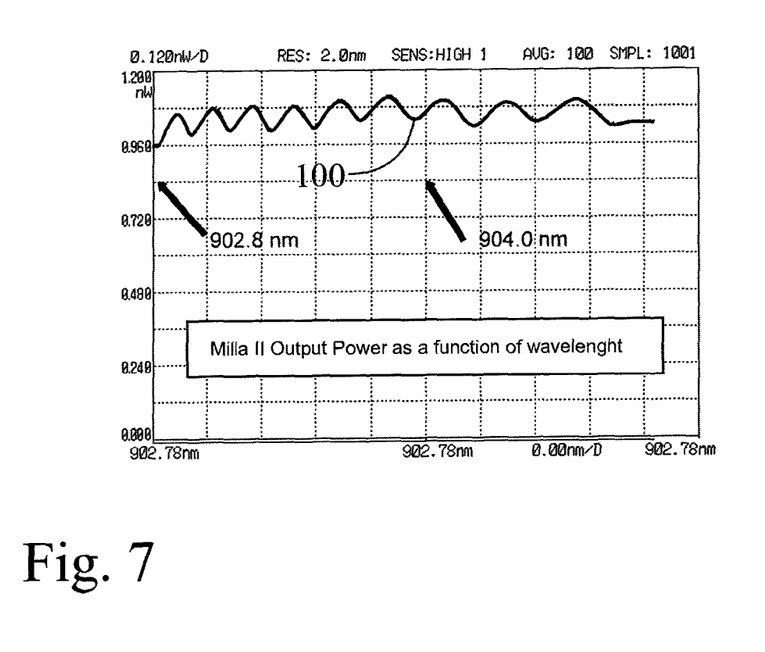
FIG. 7 presents the output power of the laser, when the interference filter is adjusted to different wavelengths.

FIG. 7 shows that, even though the laser's wavelength is adjusted to different wavelengths, the output power of the laser remains more or less the same, according to curve 100. This means that the optics according to the invention is serviceable over a sufficiently wide wavelength range and the wavelength adjustment can be performed purely by altering the angle of the filter. The optics is also not hypersensitive, for example, to changes in temperature.

Figure 8:
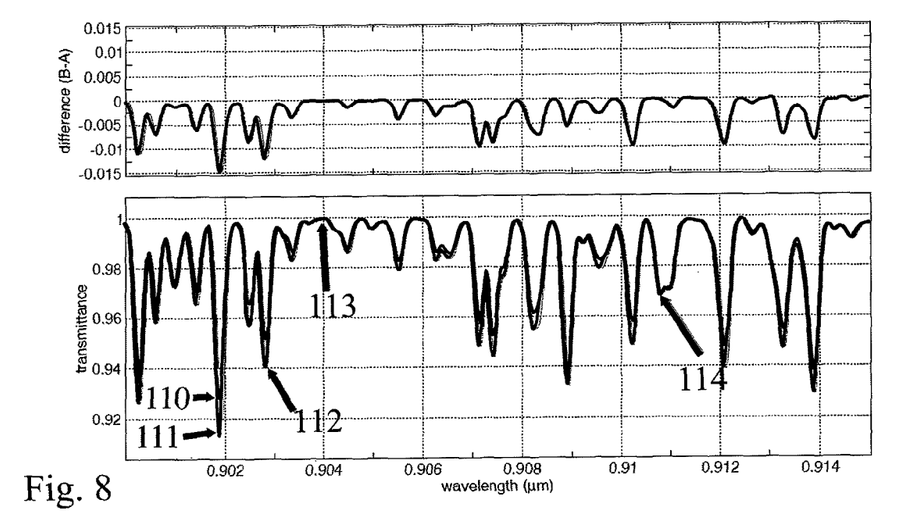
FIG. 8 presents graphically two transmission curves, which have been measured at two different temperatures, when there is water vapour in the atmosphere.

FIG. 8 shows graphically two transmittance curves 110 and 111 for an air layer containing water vapour. The upper 110 of the curves is calculated at a temperature of 296 K and the lower 111 at a temperature of 266 K, the water-vapour mixture ratio being the same in both cases. FIG. 8 shows the difference between the curves 110 and 111. As can be seen from FIG. 8, the moisture content measurement can be implemented by comparing the signals of the wavelengths 112 and 113, in which case at wavelength 113 the water vapour scarcely absorbs the measuring signal and the absorption maximum is obtained at wavelength 112. The amount of water vapour can be determined from the ration between those signals.

On the one hand, as the temperature at the water absorption maximum 114 approx. at the wavelength 911 nm has practically no effect on the absorption of water, if the mixture ratio is kept constant, this wavelength 114 can be used as a reference wavelength, if, at the same time, it is wished to determine the temperature of the air layer. Thus, transmittance at the point 113 is then measured, at which the water has practically no effect on the transmittance, and in addition at point 112, where the effect of the temperature is included and, in addition to these measurements, also at point 114, where the water-vapour mixture ration can be determined independently of the temperature. The measurements are performed by tilting the interference filter 3 sufficiently rapidly with the aid of the motor 205. In the present application, the term a sufficiently rapid measurement refers to a measurement, in which the measuring interval is at most a few seconds, preferably less than 1 second. Alternatively, a measurement of two or more wavelengths can also be implemented with the aid of two laser transmitters 200 and 201 like those depicted and a wavelength-selective dichroic mirror 202, according to FIG. 9. Three-point measurement can alternatively be implemented with the aid of two laser transmitters 200 and 201, if a motor-controlled 205 interference filter 3 is included in one of the transmitters.

The solution according to the invention is particularly advantageous in semiconductor lasers, the pulse power of which is more than 10 W.

The invention claimed is:

1. An atmospheric cloud height, humidity profile, or temperature profile measuring method, comprising:
    transmitting a pulsed laser signal through transmission optics to the atmosphere;
    detecting a signal reflected or scattered back from the atmosphere;
    stabilizing the transmitted optical power by an interference filter to a center frequency of the interference filter in the transmission optics; and
    using a multimode semiconductor pulse laser as a light source for the pulsed laser signal.

2. The method according to claim 1, wherein an adjustable interference filter is used in the stabilization.

3. The method according to claim 2, wherein an interference filter adjustable by tilting is used in the stabilization.

4. The method according to claim 2, wherein an interference filter adjustable by heating is used in the stabilization.

5. The method according to claim 2, wherein an electrically adjustable Fabry-Perot interference filter is used in the stabilization.

6. The method according to claim 1, wherein the interference filter is located at such a place in the transmission optics, in which a beam of rays is at least substantially parallel.

7. The method according to claim 1, wherein a pulsed semiconductor laser radiating from a line shaped area is used as a light source.

8. The method according to claim 1, wherein one line shaped laser is used as a light source for the measurement of the atmospheric humidity profile and/or temperature profile.

9. The method according to claim 7, wherein at least two line shaped lasers are used as the light source.

10. The method according to claim 1, wherein the following elements, listed in the direction of travel of light from a light source, are used as the transmission optics:
    a collimating lens,
    a tiltable interference filter,
    a focussing lens, and
    a semitransparent mirror.

11. The method according to claim 10, wherein a slit filter is used on the surface of a tiltable interferometer to guide the light power at a more acute transmission angle.

12. The method according to claim 1, wherein the interference filter is adjusted with the aid of a motor.

13. The method according to claim 1, wherein measurement is performed as three-point measurement at three different wavelengths, in such a way that one measurement point is a reference point, at which humidity has practically no effect, the second point is sensitive to both humidity and temperature, and the third point is sensitive to humidity and temperature in a different way than the second point, so that both the humidity and the temperature of the object can be determined.

14. The method according to claim 10, wherein measurement is performed with the aid of two laser transmitters tuned to a different wavelength and a semitransparent mirror, so that the laser transmitters are alternated in the measurement.

15. An atmospheric cloud height or humidity profile measuring apparatus, which comprises:
    a multimode diode pulse laser, and
    transmission optics, by means of which a pulsed and stabilized laser signal can be formed and transmitted on towards clouds, and
    means for detecting the signal reflected and scattered back, wherein the apparatus comprises an interference filter for stabilizing the transmitted laser power at the centre frequency of the interference filter.

16. The apparatus according to claim 15, wherein the interference filter can be adjusted.

17. The apparatus according to claim 16, wherein the interference filter can be adjusted by tilting.

18. The apparatus according to claim 16, wherein the interference filter can be adjusted by heating.

19. The apparatus according to claim 16, wherein the interference filter is an electrically adjustable Fabry-Perot interference filter.

20. The apparatus according to claim 15, wherein the interference filter is located in the transmission optics in such a place, in which a beam of rays is at least substantially parallel.

21. The apparatus according to claim 15, wherein a light source is a line shaped laser.

22. The apparatus according to claim 21, wherein a light source consists of at least two line shaped lasers.

23. The apparatus according to claim 15, wherein the transmission optics comprise the following elements, listed in the direction of travel of light from a light source:
    a collimating lens,
    a tiltable interference filter,
    a focussing lens, and
    a semitransparent mirror.

24. The apparatus according to claim 23, wherein a narrowish slit filter is used on the surface of the interference filter to guide the fed-back light power at a more acute transmission angle.

25. The apparatus according to claim 15, further comprising a motor for adjusting the interference filter.

26. The apparatus according to claim 15, further comprising means for implementing measurement as three-point measurement at three different wavelengths, in such a way that one measurement point is a reference point, in which humidity practically cannot affect, the second point is sensitive to both humidity and temperature, and the third point is sensitive to humidity and temperature in a different way to the second, so that both the humidity and the temperature of the object can be determined.

27. The apparatus according to claim 23, wherein the apparatus comprises a laser transmitter tuned to two different wavelengths and a semitransparent mirror.

* * * * *